United States Patent [19]

Iijima

[11] 3,757,173

[45] Sept. 4, 1973

[54] SEMICONDUCTOR PRESSURE SENSITIVE TRANSDUCER

[75] Inventor: Yasuo Iijima, Kobe, Japan

[73] Assignee: Matsushita Electric Industrial Co., Ltd., Osaka, Japan

[22] Filed: Nov. 8, 1971

[21] Appl. No.: 196,834

Related U.S. Application Data

[63] Continuation of Ser. No. 881,384, Dec. 2, 1969, abandoned.

[30] Foreign Application Priority Data

Dec. 4, 1968 Japan ............................43/89778
Dec. 4, 1968 Japan ............................43/89779

[52] U.S. Cl....... 317/234 R, 317/234 L, 317/235 M, 317/235 UA, 307/88.5 SD

[51] Int. Cl............................... H01l 3/00, H01l 5/00

[58] Field of Search......................... 317/234, 26, 31, 317/5.4, 5.3, 5.2; 179/100.41; 307/308; 73/88.55 D

[56] References Cited

UNITED STATES PATENTS

| | | | |
|---|---|---|---|
| 3,518,508 | 6/1970 | Yamashita et al. | 317/235 |
| 3,525,146 | 8/1970 | Hayashida et al. | 317/234 |
| 3,295,085 | 12/1966 | Nelson | 317/234 |
| 3,566,459 | 3/1971 | Rindner et al. | 317/234 |

FOREIGN PATENTS OR APPLICATIONS

| | | | |
|---|---|---|---|
| 6,617,309 | 6/1967 | Netherlands | 317/235 |

*Primary Examiner*—John W. Huckert
*Assistant Examiner*—Andrew J. James
*Attorney*—Stevens, Davis, Miller & Mosher

[57] ABSTRACT

The pressure sensitive property of a metal-semiconductor contact or a PN junction is utilized to form a mechano-electrical transducer. In such a transducer, a pressure is applied to a pressure sensitive portion through a protrusion of the semiconductor material itself, or a very hard metal or insulating material strongly adhered onto the pressure sensitive portion.

4 Claims, 5 Drawing Figures

PATENTED SEP 4 1973 3,757,173

INVENTOR
YASUO IIJIME

BY
Stevens, Davis, Miller & Mosher
ATTORNEYS

SEMICONDUCTOR PRESSURE SENSITIVE TRANSDUCER

This is a continuation, of U.S. Pat. application Ser. No. 881,384, filed Dec. 2, 1969 and now abandoned.

This invention relates to a semiconductor mechano-electrical transducer for applying a pressure and deriving a corresponding electrical signal.

With a semiconductor body is utilized for forming a mechano-electrical transducer, it should be applied with a pressure from outside to generate a stress therein. Various methods can be employed for achieving this purpose such as those by bending the semiconductor body itself and those by applying a pressure to a semiconductor body with a pin having a very small radius of curvature or through a projection protruding from a semiconductor body to concentrate the region where stress appears and various combinations thereof. However, these methods have problems in the case of manufacture, the stability of electrical properties and the length of service life.

This invention intends to solve these problems and provides a mechano-electrical transducer comprising a semiconductor body and a projection formed on a semiconductor surface which is made of very hard metal or insulating material. The projection is strongly adhered to the semiconductor surface so that an outer pressure is effectively transmitted to the semiconductor body to cause stress therein.

For example, projections of very hard metal are made by forming a strongly adhesive layer of tungsten, molybdenum, rhenium, tungsten-carbon alloy, or the like on a semiconductor body of silicon, germanium, selenium, or the like by vapor or chemical deposition or spattering and then shaping the layer into a projection or projections of predetermined size and number by masking and etching treatment, or the like to use them as the pressure application portion.

In another example, projections of a very hard insulating material are formed by forming a strongly adhesive layer of sapphire, quartz, ceramic, or the like on a semiconductor body of silicon, germanium, selenium, or the like by electron beam deposition, high frequency spattering or the like, and then shaping the layer into a projection or projections of predetermined size and number.

Now, the embodiments of the invention will be described in connection with the accompanying drawings in which.

Figure 1:
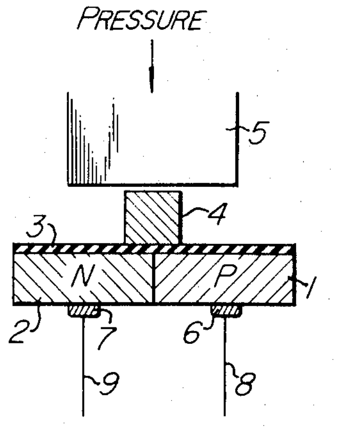
FIG. 1 is a cross-section of an embodiment of a semiconductor mechano-electrical transducer of the invention.

FIG. 1 shows a mechano-electrical transducer in which a PN junction working as a pressure sensitive portion is covered with an insulating film such as that of a silicon oxide film and a projection of very hard metal is formed on the resultant insulating film. In the figure, a semiconductor body comprises a P type region 1 and an N type region 2 which form a PN junction therebetween and is provided with an insulating film 3, a projection 4 of a very hard metal formed on the oxide film 3, electrodes 6 and 7 and lead-out wires 8 and 9 respectively connected to the P and N type regions 1 and 2. A pressure is applied to the projection 4 through an outer pressure transmitting means 5.

Figure 2:
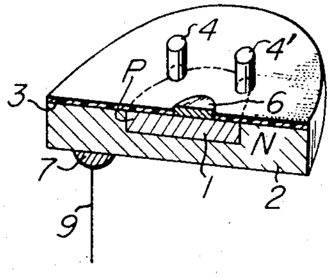
FIG. 2 is a perspective cross-sectional view of another embodiment of the invention.

FIG. 2 shows a case in which a plurality of projections are formed on a circular PN junction. Similar numerals indicate similar parts as in FIG. 1.

Figure 3:
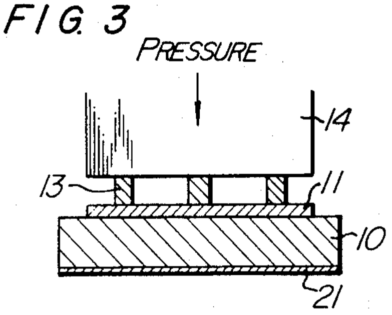
FIG. 3 is a cross-section of yet another embodiment of the invention.

FIG. 3 shows another embodiment utilizing a Schottky diode in which pojections of a very hard metal are formed on a Schottky electrode. Here, the material of the projection can be same as that of the Schottky electrode. In the figure, a Schottky diode comprising a semiconductor body 10, a Schottky electrode 11 and an ohmic electrode 12 is provided with projections 13 of a very hard metal. An outer pressure is applied to these projections 13 through an outer pressure transmitting means 14.

Projections of a very hard metal have been described hereinabove, but projections of an insulating material can be equally used as will be described hereinafter.

Figure 4:
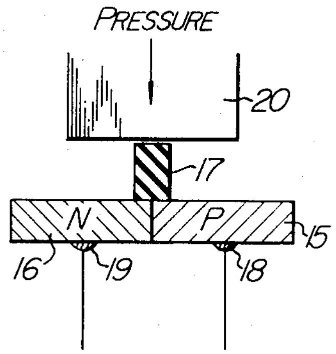
FIG. 4 is a cross-sectional view of a further another embodiment of the invention.

FIG. 4 shows a transducer utilizing a PN junction and a projection of an insulating material and comprising a semiconductor body including a P type region 15 and an N type region 16 with a PN junction therebetween, electrodes 18 and 19 connected to the regions 15 and 16 respectively, a projection of a very hard insulating material formed on the PN junction, and an outer pressure transmitting means 20.

Figure 5:
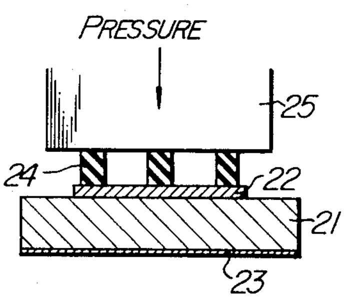
FIG. 5 is a cross-sectional view of another embodiment of the invention.

FIG. 5 shows another transducer utilizing a Schottky diode and projections of a very hard insulating material. The transducer comrises a semiconductor body 10, a Schottky electrode 11 and an ohmic electrode 12 formed on the semiconductor body, projections 13 formed on the Schottky electrode 11 and made of a very hard insulating material, and an outer pressure transmitting means 14.

According to this invention, the shape and the number of projections can be arbitrarily selected. And semiconductors doped with a deep-level-forming impurity such as copper so as to increase the pressure sensitive property can also be used.

As described above, a projection or projections of very hard metal or insulating material are formed on a semiconductor body with strong adhesion, to transmit an outer pressure to the semiconductor body. Thus, the manufacture of the device is very easy and does not need any complicated precise treatment of the semiconducotor body. Further, by appropriate selection of the material, there is obtained a high sensitivity which is almost equivalent to that of a pin type pressure application without any fear of causing unstability of the electrical properties which is due to the movement of a pressure application pin with respect to a semiconductor body. Further, connection between a transducer and an outer pressure transmitting means is made easier so as to simplify the manufacture of the mechanical portion. At the same time, the service life with respect to repetitive pressure application is very much prolonged. Further, when a very hard insulating material is used for the projection mateial, insulation between an outer pressure transmitting means and the semiconductor body is very good so that there is no need to consider the problem of further insulation.

What is claimed is:

1. A semiconductor mechano-electrical transducer comprising: a semiconductor body; and at least one columnar projection for applying an outer pressure to the semiconductor body through said projection, said projection being of material different from semiconductor material and at least as hard as said semiconductor body, and said projection being deposited by a deposition process on the semiconductor body so as to achieve secure mechanical connection therebetween.

2. A semiconductor mechano-electrical transducer according to claim 1, in which the said hard material is a metal.

3. A semiconductor mechano-electrical transducer according to claim 1, in which said hard material is an insulator.

4. A semiconductor transducer according to claim 1, wherein said semiconductor body comprises an N-type region and a P-type region forming a P-N junction at their interface, said at least one projection being located on the surface of said semiconductor body over said P-N junction.

* * * * *